(12) United States Patent
Saitoh et al.

(10) Patent No.: US 9,819,093 B2
(45) Date of Patent: Nov. 14, 2017

(54) ELECTROMAGNETIC WAVE ABSORBER AND ELECTROMAGNETIC WAVE ANECHOIC ROOM

(71) Applicant: TDK Corporation, Tokyo (JP)

(72) Inventors: Toshifumi Saitoh, Tokyo (JP); Yoshihito Hirai, Tokyo (JP); Hiroshi Kurihara, Tokyo (JP); Motonari Yanagawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 302 days.

(21) Appl. No.: 14/699,081

(22) Filed: Apr. 29, 2015

(65) Prior Publication Data

US 2015/0340766 A1 Nov. 26, 2015

(30) Foreign Application Priority Data

May 20, 2014 (JP) .................................. 2014-104635

(51) Int. Cl.
*H01Q 17/00* (2006.01)
*H05K 9/00* (2006.01)

(52) U.S. Cl.
CPC ......... *H01Q 17/008* (2013.01); *H05K 9/0001* (2013.01); *H05K 9/0073* (2013.01)

(58) Field of Classification Search
CPC ... H01Q 17/008; H05K 9/0001; H05K 9/0073
USPC .............................................................. 342/4
See application file for complete search history.

(56) References Cited

U.S. PATENT DOCUMENTS

| 6,771,204 B2 | 8/2004 | Hayashi et al. |
| 2007/0030194 A1* | 2/2007 | Kurihara ............... H01Q 17/008 342/1 |
| 2011/0227775 A1* | 9/2011 | Hirose .................. H01Q 17/00 342/1 |

FOREIGN PATENT DOCUMENTS

| JP | 1-171096 U | 12/1989 |
| JP | 3-39898 U | 4/1991 |
| JP | 7-22769 A | 1/1995 |
| JP | 2003-229691 A | 8/2003 |
| JP | 2005-32781 A | 2/2005 |
| JP | 2007-67395 A | 3/2007 |
| JP | 2009158826 A * | 7/2009 |
| JP | 4420253 B2 | 12/2009 |
| JP | 4988060 B1 | 5/2012 |

OTHER PUBLICATIONS

Japanese Patent Office; Office Action in Japanese Patent Application No. 2014-104635 (dated Feb. 3, 2016).

* cited by examiner

*Primary Examiner* — Timothy A Brainard
(74) *Attorney, Agent, or Firm* — Leydig Voit and Mayer

(57) ABSTRACT

An electromagnetic wave absorber and an electromagnetic wave anechoic room using the absorbers. The electromagnetic wave absorber has improved electromagnetic wave absorption characteristics at high frequencies in spite of having a hollow structure. The electromagnetic wave absorber includes a hollow shell with a bottom that is a rectangle. A part of a surface of the hollow shell and an outer face of a planar extension lie in planes that are not parallel to any side of the rectangle. At least the plane that is not parallel to any side of the rectangle is included in a surface of an electromagnetic wave absorption member.

18 Claims, 13 Drawing Sheets

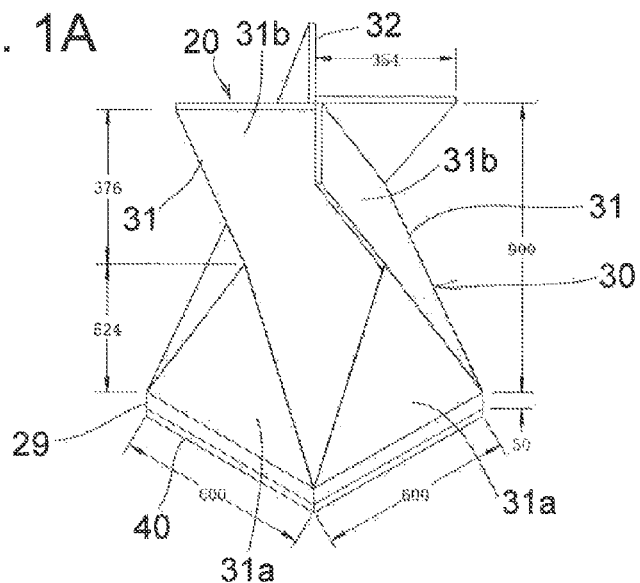
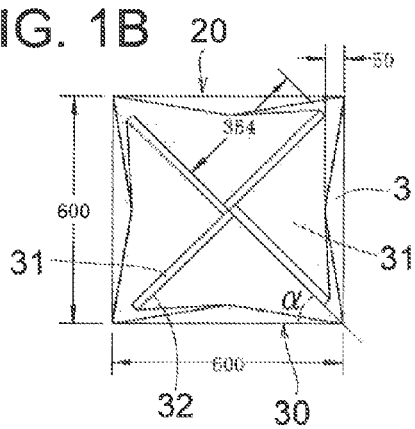
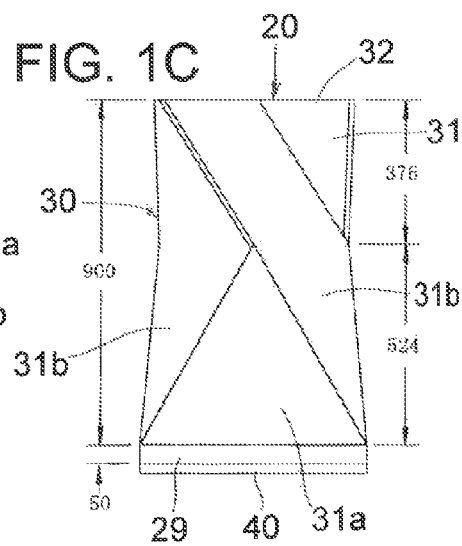
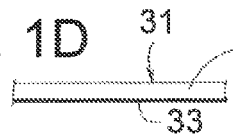
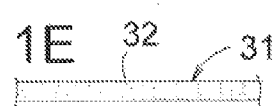

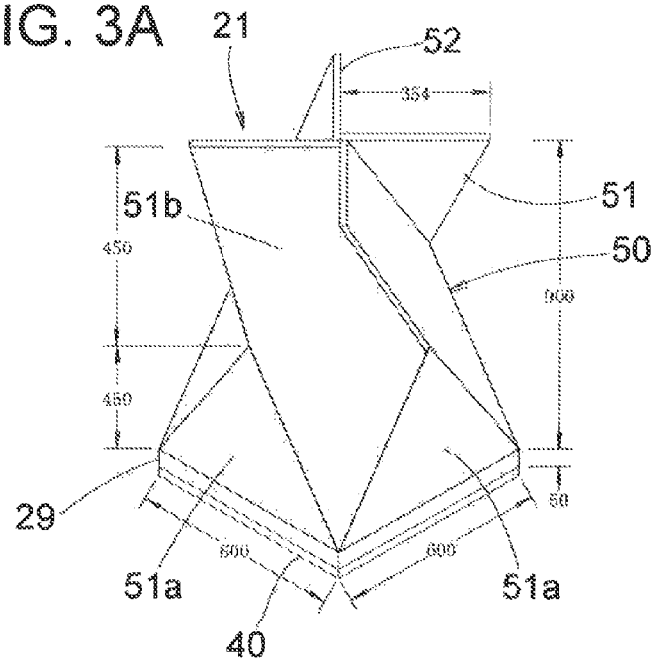
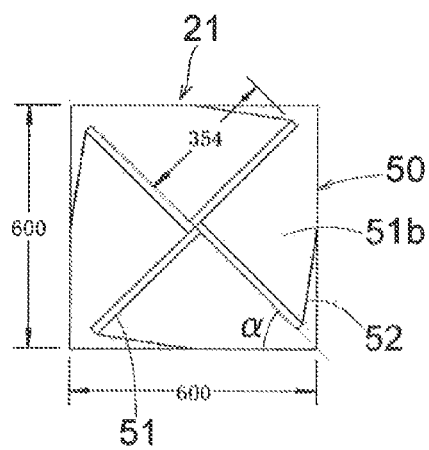
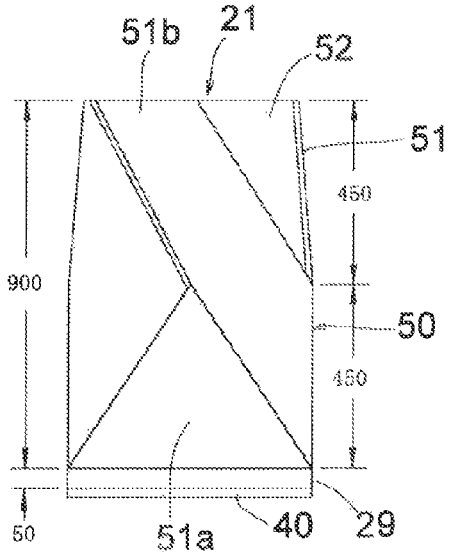

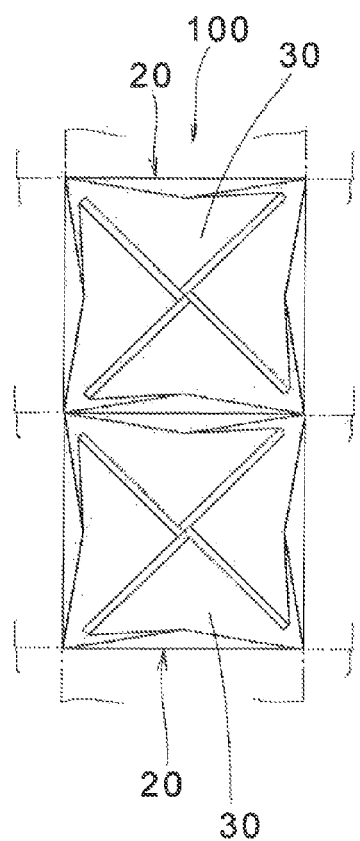
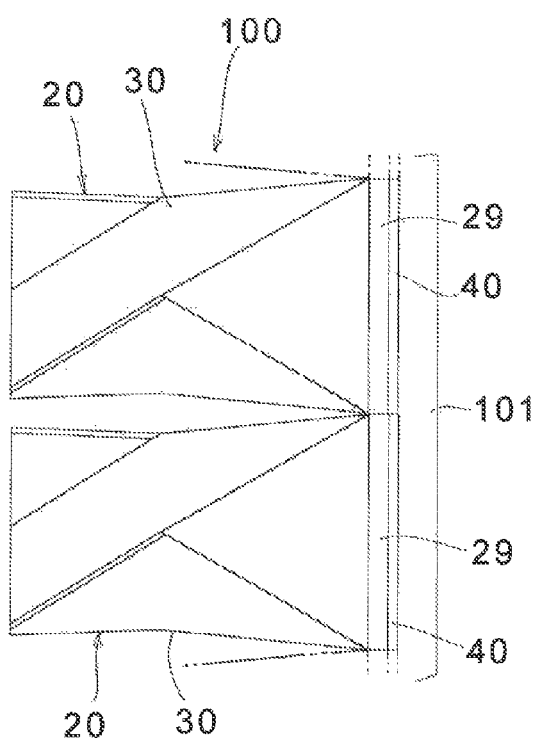

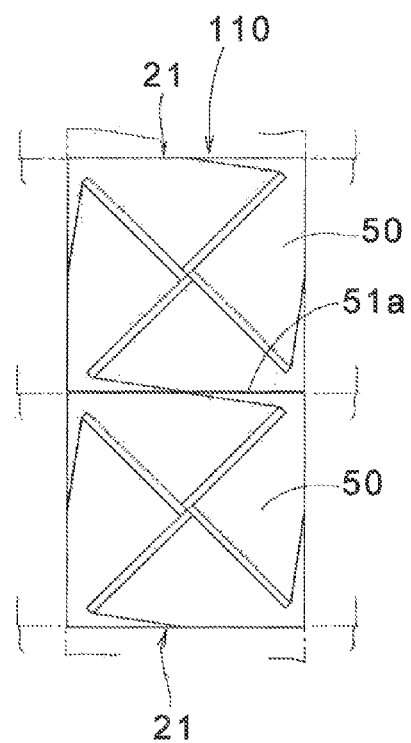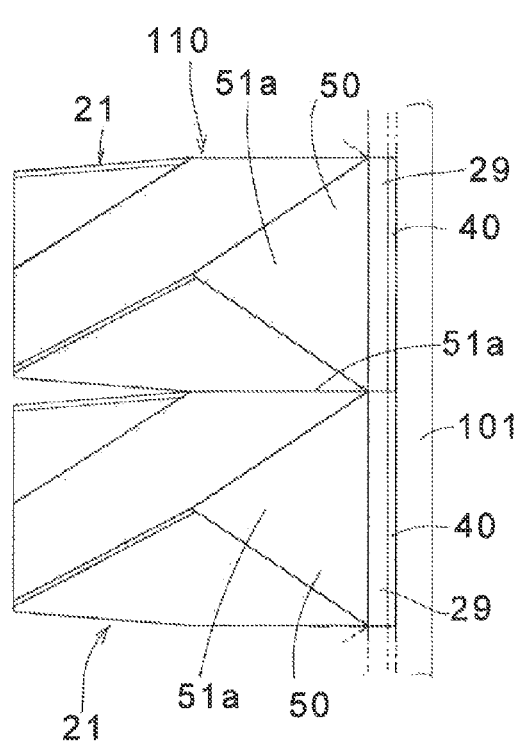

FIG. 13A
PRIOR ART
FIG. 13B
PRIOR ART
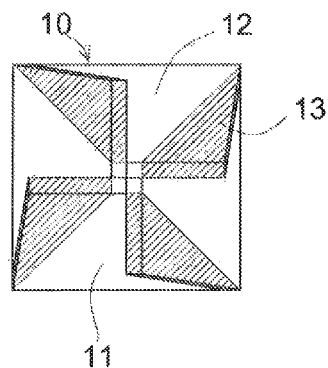
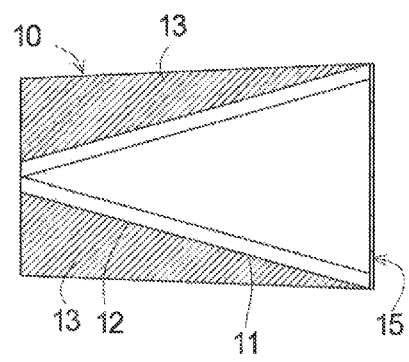

ELECTROMAGNETIC WAVE ABSORBER AND ELECTROMAGNETIC WAVE ANECHOIC ROOM

BACKGROUND OF THE INVENTION

Field of the Invention

The present invention relates to an electromagnetic wave absorber having a hollow structure, and to an electromagnetic wave anechoic room using the absorber.

Description of the Prior Art

As an electromagnetic wave absorber used in an electromagnetic wave anechoic room, a solid absorber of a pyramid (quadrangular pyramid) or wedge shape conventionally has been often employed. Also for weight and cost reduction, a hollow absorber of a pyramid or wedge shape conventionally has been often employed.

Generally, a hollow electromagnetic wave absorber is composed of plate-like electromagnetic wave absorption members containing a resistance material as carbon etc. or plate-like electromagnetic wave absorption members including a resistance layer on a surface thereof. A foamed styrol board containing carbon inside, a corrugated board structure consisting of mixed papers or a plastic board containing carbon inside, and a foamed styrol board provided with a resistance layer on a surface thereof etc. are examples of the plate-like electromagnetic wave absorption member.

When an electric field of an incident electromagnetic wave and the plate-like electromagnetic wave absorption member are parallel, both absorption and surface-reflection are large in electromagnetic wave absorption characteristics of the plate-like electromagnetic wave absorption member, and when the electric field of the incident electromagnetic wave and the plate-like electromagnetic wave absorption member are vertical, both absorption and surface-reflection are small.

FIG. 10A, FIG. 10B and FIG. 10C show a prior art of an electromagnetic wave absorber having a hollow pyramid shape and a combination of plate-like electromagnetic wave absorption members. FIG. 10A is a plan view as seen from an incident direction of an electromagnetic wave, FIG. 10B is a side view, and FIG. 10C is a XC-XC line cross sectional view of FIG. 10B. In the cross sectional view shown FIG. 10C of the prior art, the electromagnetic wave absorption member 1 parallel to the electric field of the incident electromagnetic wave has large absorption and large surface-reflection, and the electromagnetic wave absorption member 2 vertical to the electric field of the incident electromagnetic wave has small absorption and small surface-reflection. Namely, when the incident electromagnetic wave is high frequency of short wave length, in an area A of FIG. 10A as seen from the incident direction of electromagnetic wave, the absorption is large because the electric field of the incident electromagnetic wave and the electromagnetic wave absorption member are parallel. On the other hand, in an area B of FIG. 10A the absorption is small because the electric field of the incident electromagnetic wave and the electromagnetic wave absorption member are vertical, and large reflection is caused by the area B. When a plurality of electromagnetic wave absorbers 3 of FIG. 10A, FIG. 10B and FIG. 10C are arranged as shown in FIG. 11A and FIG. 11B, the surface-reflection is large in the area A, and also multipath reflection is increased.

As a result of the above, it is apparent that the conventional hollow electromagnetic wave absorber has a problem that the electromagnetic wave absorption characteristics are low in high frequency.

Conventional electromagnetic wave absorbers for constituting electromagnetic wave anechoic rooms are disclosed in Japanese Utility Model Application Laid-Open No. 1-171096, Japanese Patent No. 4988060, and Japanese Patent No. 4420253.

In case of disposing a plurality of electromagnetic wave absorbers on a side wall surface (or side door), Japanese Utility Model Application Laid-Open No. 1-171096 as shown in FIG. 12A and FIG. 12B discloses a configuration in which electromagnetic wave absorbers 5 consisting of parallel arrangements of chevron-shaped electromagnetic wave absorption members are disposed on the side wall surface 7 so as to be inclined about 45° to a line of intersection between a floor surface 6 and the side wall surface 7 (or side door).

In this case, whether the electric field direction of the incident electromagnetic wave is horizontal or vertical (horizontally-polarized wave or vertically-polarized wave), it seems to be expected effects of improving electromagnetic wave absorption characteristics in a high frequency range, because the electric field direction is not vertical to the outer surfaces of the electromagnetic wave absorbers 5. However, as shown in FIG. 12A and FIG. 12B, many jagged parts disable to arrange the electromagnetic wave absorbers are existing around end portions of wall surfaces and near areas of an opening as a door or the like. Because reflections of the jagged parts degrade the absorption characteristics of an electromagnetic wave anechoic room, there is a problem that must fill the jagged parts by disposing electromagnetic wave absorbers specially processed.

Japanese Patent No. 4988060 discloses an electromagnetic wave absorber unit which integrally has a plurality of pyramid shape electromagnetic wave absorbers inclined at 45°. In this case, the similar problem exists because the electromagnetic wave absorber units form a jagged outline shape when the units are arranged side by side. For instance, parts disable to arrange the electromagnetic wave absorbers are existing around end portions of wall surfaces and near areas of an opening as a door or the like of an electromagnetic wave anechoic room, therefore there is a problem that must fill the parts by disposing electromagnetic wave absorbers specially processed.

As shown in FIG. 13A and FIG. 13B, Japanese Patent No. 4420253 discloses a electromagnetic wave absorber 10 which has side face forming parts 12 forming side faces of the hollow pyramid 11 respectively, and extending parts 13 each of which extended to protrude from one ridgeline of each part 12 in the same plane from the part 12, wherein the extending part 13 is present only one for one ridgeline. A magnetic loss body 15 of plat-like ferrites (ferrite tiles) etc. is arranged at a bottom side of the electromagnetic wave absorber 10. Japanese Patent No. 4420253 alleges that favorable electromagnetic wave absorption characteristics are obtained in a wide range of from low frequency to high frequency. However, because the side face forming part 12 and the extending part 13 which extends in the same plane of the part 12 are parallel or vertical to the electric field direction of the incident electromagnetic wave, decrease of electromagnetic wave absorption characteristics caused by areas vertical to the electric field direction of the incident electromagnetic wave are not ignorable.

SUMMARY OF THE INVENTION

Under such circumstance, an object of the present invention is to provide an electromagnetic wave absorber able to improve electromagnetic wave absorption characteristics in high frequency in spite of having a hollow structure, and to provide electromagnetic wave anechoic room using the absorbers.

A first aspect of the present invention is an electromagnetic wave absorber. The electromagnetic wave absorber comprises a hollow shell of which an outer shape at a bottom is a rectangle, wherein a part of a surface of the hollow shell is a non-parallel plane to each side of the rectangle, and at least the non-parallel plane includes an electromagnetic wave absorption member.

In the first aspect, the electromagnetic wave absorption member may be a plate-like electromagnetic wave absorption member which includes a tip side face bent toward a distal end side, and a line of intersection between the tip side face and a cross sectional plane parallel to the bottom is non-parallel to each side of the rectangle.

A second aspect of the present invention is an electromagnetic wave absorber. The electromagnetic wave absorber comprises a hollow shell including a plate-like projecting portion, and an outer shape of the hollow shell at a bottom being a rectangle, wherein the projecting portion includes a non-parallel plane to each side of the rectangle, and the non-parallel plane and at least a part of the hollow shell include an electromagnetic wave absorption member.

In the second aspect, the hollow shell may include a quadrangular pyramid and the plate-like projecting portion protruding along a ridgeline of the quadrangular pyramid.

In the first or second aspect, the electromagnetic wave absorption member may be a plate-like electromagnetic wave absorption member.

In the first or second aspect, an angle α between one side of the rectangle and a line of intersection of the non-parallel plane and a cross sectional plane parallel to the bottom may be $30°≤α≤60°$.

In the first aspect, when the electromagnetic wave absorption member is a plate-like electromagnetic wave absorption member which includes a tip side face bent toward a distal end side, an angle α between one side of the rectangle and a line of intersection of the tip side face and a cross sectional plane parallel to the bottom may be $30°≤α≤60°$.

In the first or second aspect, the electromagnetic wave absorption member may include a dielectric and a resistance layer provided on a surface of the dielectric.

In the first or second aspect, the electromagnetic wave absorption member may include a dielectric and a resistance material contained in the dielectric.

In the first or second aspect, a magnetic loss material may be provided with the bottom side of the hollow shell.

A third aspect of the present invention is an electromagnetic wave anechoic room. The electromagnetic wave anechoic room comprises the electromagnetic wave absorbers according to the first or second aspect, wherein a plurality of the electromagnetic wave absorbers are arranged on at least one surface of indoor side wall surfaces and a ceiling surface, so that a distal end side of the electromagnetic wave absorbers is directed to the indoor side and one side of the bottom of the absorbers is parallel with a floor surface.

It is to be noted that any arbitrary combination of the above-described structural components as well as the expressions according to the present invention changed among a system and so forth are all effective and encompassed by the present aspects.

According to the aspects described above, in case of having a hollow shell of which an outer shape at a bottom is a rectangle, electromagnetic wave absorption characteristics can be improved because of providing a non-parallel plane to each side of the rectangle. Also, an electromagnetic wave anechoic room of excellent electromagnetic wave absorption characteristics can be realized by using the electromagnetic wave absorber.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, the drawings in which:

FIG. 1A is a perspective view showing a first embodiment of an electromagnetic wave absorber according to the invention, FIG. 1B is a plan view as seen from an incident direction of an electromagnetic wave showing the first embodiment, FIG. 1C is a front view of the first embodiment, FIG. 1D is an enlarged cross-sectional view showing an example of a plate-like electromagnetic wave absorption member used in the first embodiment, and FIG. 1E is an enlarged cross-sectional view showing another example of a plate-like electromagnetic wave absorption member used in the first embodiment.

FIG. 3A is a perspective view showing a second embodiment of an electromagnetic wave absorber according to the invention, FIG. 3B is a plan view as seen from an incident direction of an electromagnetic wave showing the second embodiment, and FIG. 3C is a front view of the second embodiment.

FIG. 6A is a perspective view showing a fifth embodiment, FIG. 6B is a perspective view showing a sixth embodiment, and FIG. 6C is a perspective view of a seventh embodiment, respectively.

FIG. 8A is a plan view as seen from an incident direction of an electromagnetic wave showing an eighth embodiment disclosing an electromagnetic wave anechoic room according to the invention, and FIG. 8B is a cross-sectional side view of the eighth embodiment.

FIG. 9A is a plan view as seen from an incident direction of an electromagnetic wave showing a ninth embodiment disclosing an electromagnetic wave anechoic room according to the invention, and FIG. 9B is a cross-sectional side view of the ninth embodiment.

FIG. 10A is a plan view as seen from an incident direction of an electromagnetic wave, FIG. 10B is a side sectional view according to a section through a top, and FIG. 10C is a XC-XC line cross sectional view of FIG. 10B.

FIG. 11A is a plan view as seen from an incident direction of an electromagnetic wave, and FIG. 11B is a front sectional view according to a section through a top.

FIG. 12A is a perspective view, and FIG. 12B is a front view showing continuous placements of the electromagnetic wave absorbers.

FIG. 13A and FIG. 13B are showing an electromagnetic wave absorber (comparative example) disclosed in Japanese Patent No. 4420253. FIG. 13A is a plan view as seen from an incident direction of an electromagnetic wave, and FIG. 13B is a side view.

DETAILED DESCRIPTION OF THE INVENTION

Figure 2A:
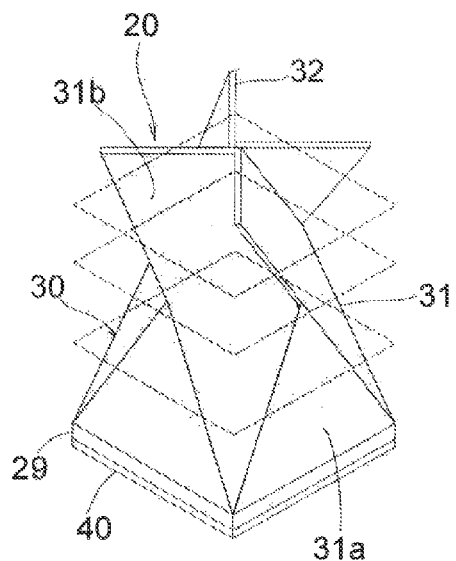
FIG. 2A is a perspective view added cross-sectional position (upper, middle, lower) showing the first embodiment.

The invention will now be described based on the following embodiments which do not intend to limit the scope of the present invention but exemplify the invention. All of the features and the combinations thereof described in the embodiments are not necessarily essential to the invention.

The first embodiment of an electromagnetic wave absorber 20 of the invention is explained according to FIGS. 1A, 1B, 1C, 1D, and 1E and FIGS. 2A, 2B, 2C, 2D and 2E. As shown in those figures, a base plate 29 consists of low-permittivity dielectrics, for example foamed styrol, that is a square plate of 600 mm (one side)×600 mm (another side)×50 mm (thickness). A hollow shell 30 is obtained by combining four plate-like electromagnetic wave absorption members 31 so that an outer shape at a bottom face of the hollow shell 30 form a square of the same size as the base plate 29. On the base plate 29 (electromagnetic wave incident side), the hollow shell 30 is placed and integrated with adhesive or the like. A magnetic loss body 40 of plat-like ferrites (ferrite tiles) etc. is placed behind the base plate 29. The base plate 29 is attached by adhesive or the like to the magnetic loss body 40. The base plate 29 is a member which is provided for reinforcement of the hollow shell 30 and attachment to the magnetic loss body 40, and may be omitted.

Four plate-like electromagnetic wave absorption members 31 constituting of the hollow shell 30 are connected at the bottom thereof to each one side of the base plate 29 of a square bottom face respectively. Each plate-like electromagnetic wave absorption member 31 has an outer face part that is a parallel face 31a of an isosceles triangle parallel to one side of the base plate 29, and the other outer face part that is a tip side outer face bent toward a distal end side while the outer face part of the parallel face 31a is remained parallel. The tip side outer face is a non-parallel face 31b which is non-parallel to all sides of the base plate 29, and the non-parallel face 31b is at an angle α (30°≤α≤60°, more preferably α=45°) with respect to one side of the base plate 29. The four electromagnetic wave absorption members 31 are combined each other with adhesion bond, adhesion tape or the like, so as to form a hollow polyhedron (however, the bottom face only is open) and a plate-like extension 32 as a plate-like projecting portion which protrudes from the hollow polyhedron. An outer face of the plate-like extension 32 is included in the non-parallel face 31b, and is a portion that protrudes from one of the non-parallel face 31b of an adjacent electromagnetic wave absorption member 31. The height of the hollow shell 30 is 900 mm, the height of the parallel faces 31a of the isosceles triangle is 524 mm, the height of the plate-like extension 32 is 376 mm. Furthermore, the protruding length of the tip of the plate-like extension 32 is 354 mm.

For example as shown in FIG. 1D, each plate-like electromagnetic wave absorption member 31 consists of low-permittivity dielectric body 32 such as foamed styrol (or dielectrics of seemingly low dielectric constant, such as a corrugated board structure) and a resistance layer 33 of carbon or the like on a surface of the dielectric body 32. Also, shown in FIG. 1E, the electromagnetic wave absorption member 31 may consist of the low-permittivity dielectric body 32 such as foamed styrol (or dielectrics of seemingly low dielectric constant, such as a corrugated board structure) and resistance material such as carbon or the like contained and dispersed in the dielectric body 32. In case of FIG. 1D, it is preferable to use the electromagnetic wave absorption member 31 so that a surface provided with the resistance layer 33 is arranged to be an outer surface of the hollow shell 30, but it is possible that the surface provided with the resistance layer 33 is arranged to be an inner surface.

Figure 2B:
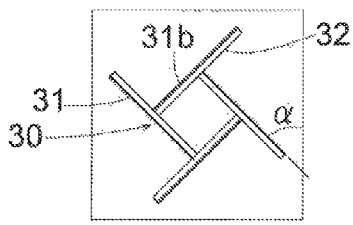
FIG. 2B is a cross-sectional view at the upper cross-sectional position.
Figure 2C:
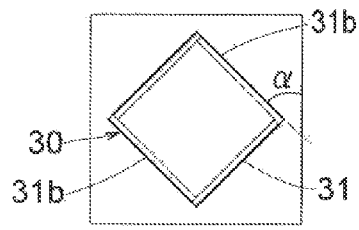
FIG. 2C is a cross-sectional view at the middle cross-sectional position.
Figure 2D:
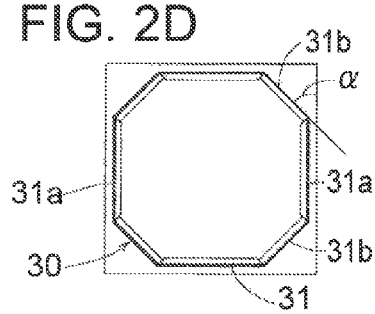
FIG. 2D is a cross-sectional view at the lower cross-sectional position.
Figure 2E:
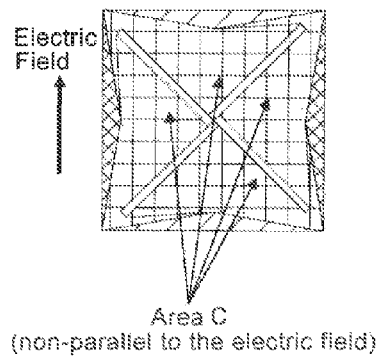
FIG. 2E is a plan view as seen from the incident direction of the electromagnetic wave showing areas C non-parallel to the electric field of the incident electromagnetic wave are wide.

FIG. 2A is a perspective view of hollow shell 30 added cross-sectional position (upper, middle, lower), and FIG. 2B is a cross-sectional view at the upper cross-sectional position parallel to the bottom of the hollow shell 30 (when cut by a parallel plane passing through the plate-like extension 32). It can be seen that the hollow pyramidal portion is formed by the non-parallel faces 31b inclined by the angle α (30°≤α≤60°, more preferably α=45°) with respect to one side of the bottom, and an outer face of the plate-like extension 32 projecting from the hollow pyramidal portion is formed of an extension of the non-parallel face 31b. FIG. 2C is a cross-sectional view at the middle cross-sectional position (when cut by a parallel plane passing through each top of the parallel face 31a of the isosceles triangle), and the hollow pyramidal portion is formed by the non-parallel faces 31b inclined by the above mentioned angle α with respect to one side of the bottom. FIG. 2D is a cross-sectional view at the lower cross-sectional position (when cut by a parallel plane passing through the parallel faces 31a and non-parallel faces 31b), and there is formed an octagonal cross section in which the non-parallel face 31b inclined by the angle α is located between the parallel faces 31a of four sides parallel to the bottom sides of the hollow shell 30 respectively. Therefore, it can be seen that areas C of the hollow shell 30 non-parallel to the electric field of the incident electromagnetic wave, namely inclined by the angle α (30°≤α≤60°, more preferably α=45°) with respect to the electric field, are wide as seen from the incident direction of the electromagnetic wave.

Figure 7:
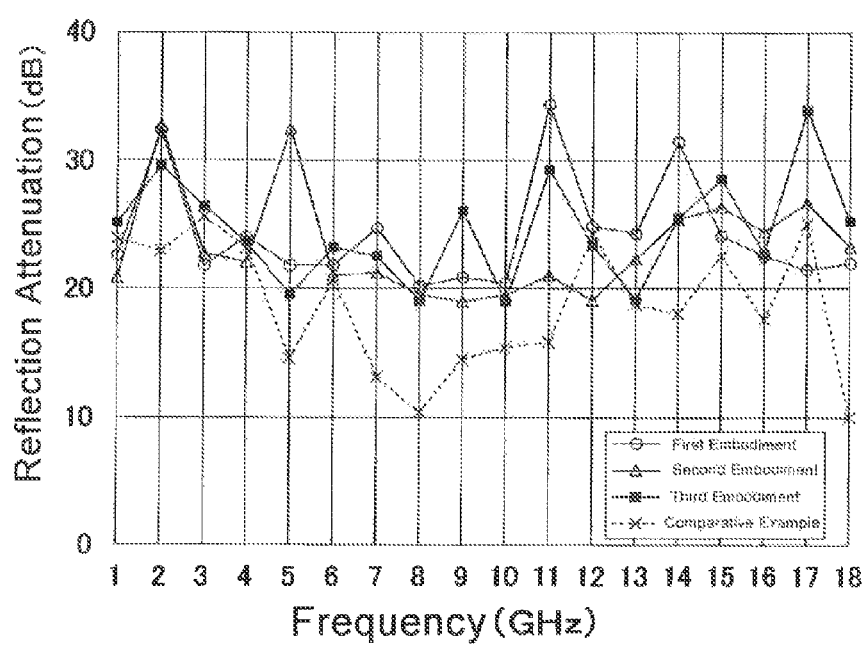
FIG. 7 is a graph of electromagnetic wave absorption characteristics of the first to third embodiments comparing with that of Japanese Patent No. 4420253 shown in FIG. 13A and FIG. 13B.
Figure 10A:
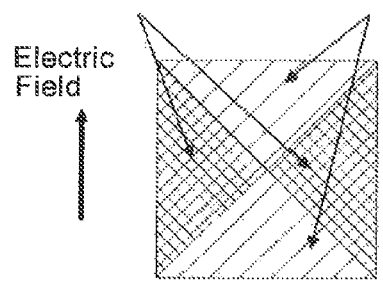
FIG. 10A, FIG. 10B and FIG. 10C are showing a conventional example of an electromagnetic wave absorber having a hollow pyramid shape and a combination of plate-like electromagnetic wave absorption members.
Figure 10B:
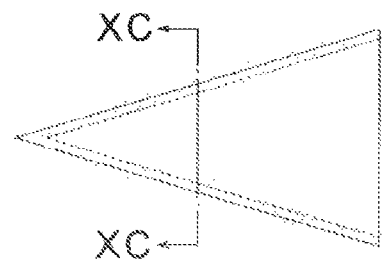
Figure 10C:
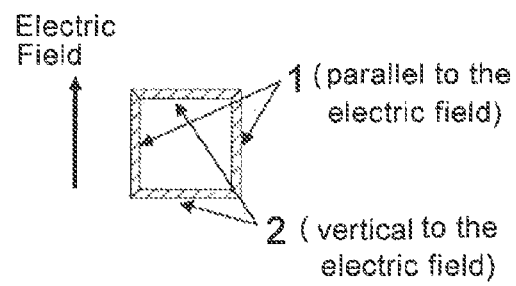
Figure 11A:
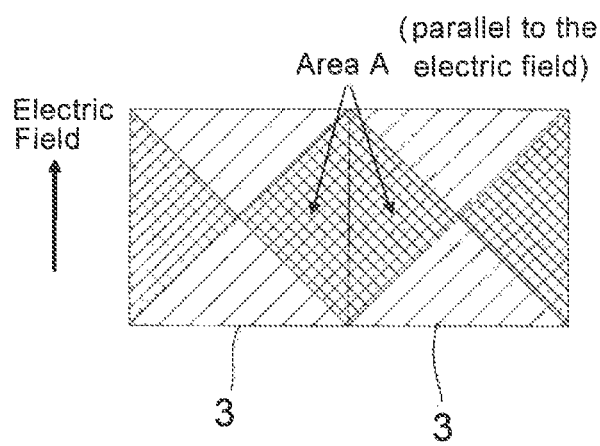
FIG. 11A and FIG. 11B are showing continuous placements of the electromagnetic wave absorbers of the hollow pyramid shape shown in FIG. 10A, FIG. 10B and FIG. 10C.
Figure 11B:
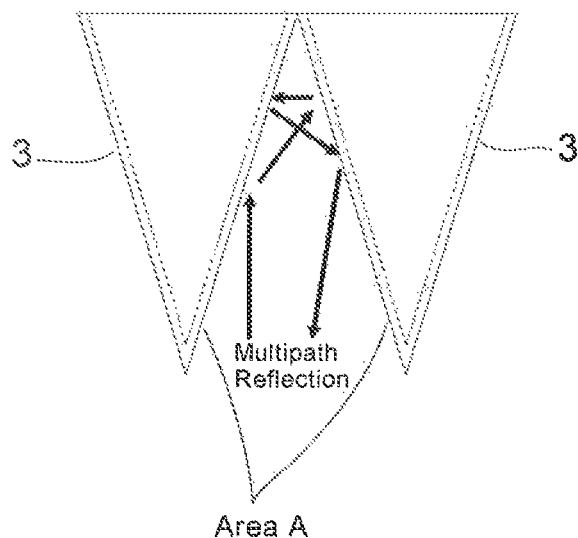

FIG. 7 is a graph of electromagnetic wave absorption characteristics data of the first to third embodiments comparing with an comparative example shown in FIG. 13A and FIG. 13B. The electromagnetic wave absorber of the comparative example is the same bottom dimension (600 mm×600 mm) and the same height (900 mm, however, not including the thickness of the magnetic loss member 15) as that of the electromagnetic wave absorber 20 of the first embodiment, and the same electromagnetic wave absorption member consisting of the low-permittivity dielectric body 32 and the resistance layer 33 thereon as shown in FIG. 1D is used in both the first to third embodiments and the comparative example. FIG. 7 shows the measurement data when the angle α is equal to 45° in all embodiments, both the embodiments and the comparative example are provided with ferrite tiles as the magnetic loss member, a plurality of the electromagnetic wave absorbers are arranged side by side, and an incident electric wave of vertical polarization is entered.

In case of comparing with the first embodiment of the present invention and the comparative example, reflection attenuation (dB) of the first embodiment is better than that of the comparative example in most of the band of 1 GHz 18 GHz.

According to the first embodiment following effects are obtained.

(1) As can be seen from the each section of FIGS. 2A, 2B, 2C and 2D, the hollow shell 30 of the electromagnetic wave absorber 20 has the outer face of the plate-like electromagnetic wave absorption member 31, that is the non-parallel face 31b, which inclined by at an angle α (30°≤α≤60°, more preferably α=45°) with respect to one side of the bottom (square) of the hollow shell 30. Therefore, even if placing electromagnetic wave absorbers 20 on walls and a ceiling of an electromagnetic wave anechoic room so that one side of the bottom of the hollow shell 30 is made to be parallel to a boundary line of walls and a ceiling surface, or a floor and the walls, that is a general arrangement of absorbers, the non-parallel face 31b is at an angle α (30°≤α≤60°, more preferably α=45°) with respect to the electric field of the incident electromagnetic wave of horizontal or vertical polarization that is usually general. For the reason, almost an intermediate absorption and surface-reflection characteristics are obtained compared with characteristics in case of electromagnetic wave absorption member 31 being parallel to the electric field of the incident electromagnetic wave or being vertical to the electric field of the incident electromagnetic wave. As seen from the incident direction of the electromagnetic wave (FIG. 2E), because the electromagnetic wave absorber 20 is widely covered by areas of the electromagnetic wave absorption members 31 having the intermediate absorption and surface-reflection characteristics (areas C), almost no area causes large reflections in the high frequency range, also multipath reflections are reduced when a plurality of the absorbers 20 are arranged side by side, and thus better electromagnetic wave absorption characteristics are realized in the high frequency range.

In case of the angle α is less than 30° and greater than 60°, it means that there are surfaces nearly vertical to the electric field of the incident electromagnetic wave, thus improvement effect of electromagnetic wave absorption characteristics is reduced.

Figure 12A:
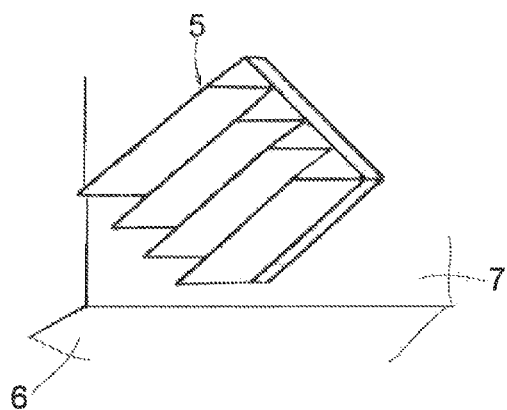
FIG. 12A and FIG. 12B are showing an arrangement of electromagnetic wave absorbers disclosed in Japanese Utility Model Application Laid-Open No. 1-171096.
Figure 12B:
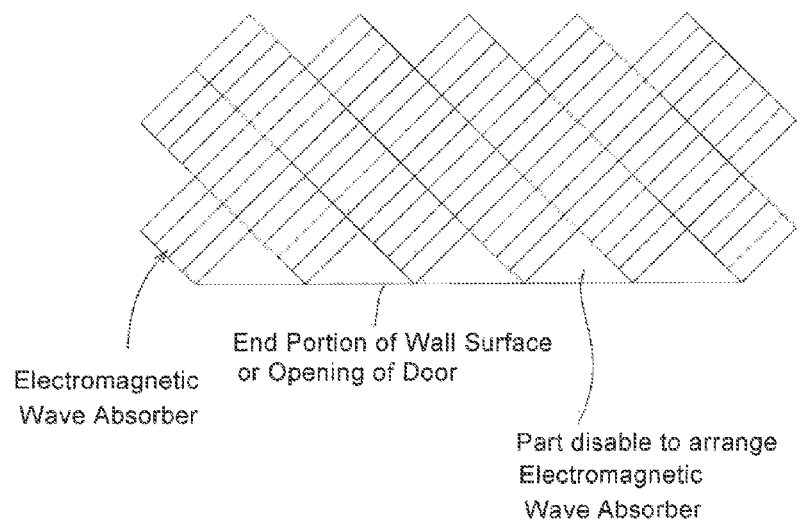

(2) In case of placing the electromagnetic wave absorbers 20 on the walls and the ceiling of the electromagnetic wave anechoic room, one side of the bottom of the hollow shell 30 may be arranged parallel to the boundary line of the walls and the ceiling surface, or the floor and the walls as a general arrangement of absorbers. Therefore, it is not necessary to adopt a special arrangement configuration disclosed in Japanese Utility Model Application Laid-Open No. 1-171096 shown in FIGS. 12A and 12B, and it is not necessary to fill spaces existing around end portions of wall surfaces and near areas of an opening as a door or the like by disposing electromagnetic wave absorbers specially processed. As a result, it is possible to construct an electromagnetic wave anechoic room at a low cost.

(3) Because the tip side outer face (the non-parallel face 31b) of four plate-like electromagnetic wave absorption members 31 is formed by bending toward the distal end side of the member 31 so that the line of intersection between the non-parallel face 31b and the cross sectional plane parallel to the square bottom is non-parallel to the each side of the square bottom, it is easy to manufacture the hollow shell 30, and possible to reduce production cost.

(4) Because the hollow shell 30 has plate-like extensions 32 protruding from the polyhedron part, it is possible to further improve the electromagnetic wave absorption characteristics.

The second embodiment of an electromagnetic wave absorber 21 of the invention is explained according to FIGS. 3A, 3B and 3C. In a hollow shell 50 of the second embodiment, size relationship of a parallel face 51a and a non-parallel face 51b of an electromagnetic wave absorption member 51 is determined, so that the parallel face 51a of a isosceles triangle parallel to one side of the base plate 29 stand vertically from the base plate 29, although the parallel face 31a of the isosceles triangle parallel to one side of the base plate 29 is inclined inside from a vertical plane to the base plate 29 in the hollow shell 30 of above mentioned first embodiment. Namely, the height of the hollow shell 50 is 900 mm, but the height of the parallel faces 51a of the isosceles triangle is 450 mm, also the height of the plate-like extension 52 is 450 mm. Other configurations are the same as the first embodiment described above.

As shown in the electromagnetic wave absorption characteristics data of FIG. 7, reflection attenuation (dB) of the second embodiment is better than that of the comparative example in most of the band of 1 GHz 18 GHz, in case of comparing with the second embodiment and the comparative example.

In the second embodiment, the same effects as the first embodiment described above are obtained.

Figure 4A:
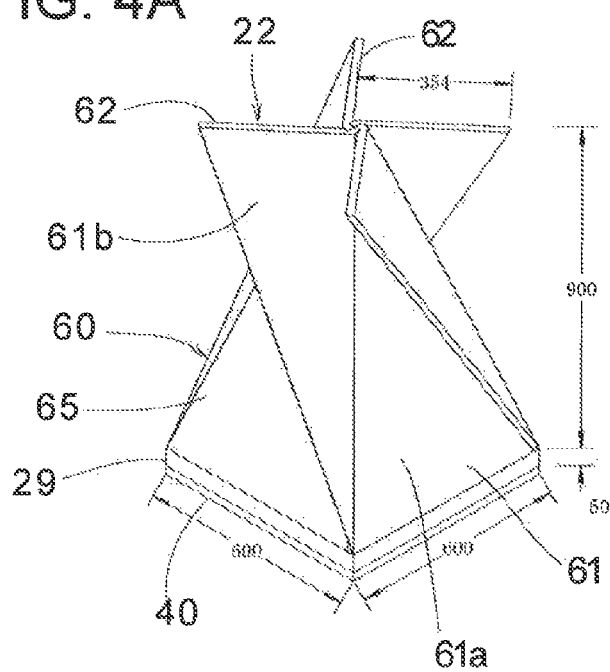
FIG. 4A is a perspective view showing a third embodiment of an electromagnetic wave absorber according to the invention.
Figure 4B:
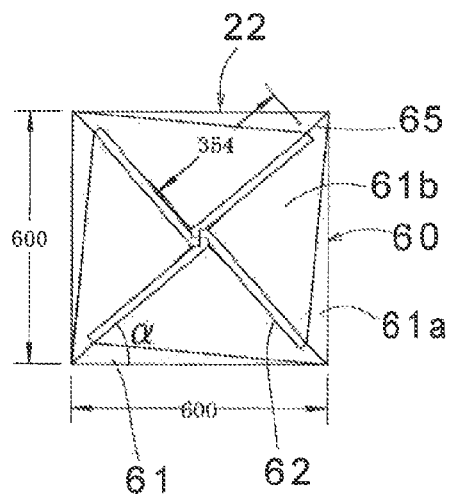
FIG. 4B is a plan view as seen from an incident direction of an electromagnetic wave showing the third embodiment.
Figure 4C:
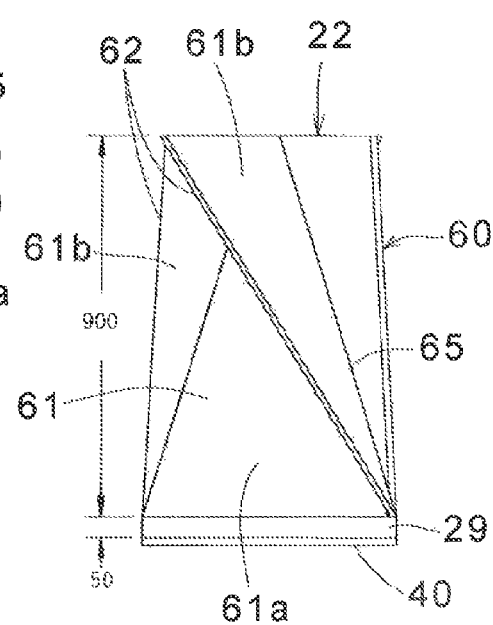
FIG. 4C is a front view of the third embodiment.

The third embodiment of an electromagnetic wave absorber 22 of the invention is explained according to FIGS. 4A, 4B and 4C. In the embodiment, a hollow shell 60 mounted and fixed on the base plate 29 is made of four plate-like electromagnetic wave absorption member 61 combined with each other so that the hollow shell 60 has a square quadrangular pyramid 65 and plate-like extensions 62 as plate-like projecting portions which protrude from each ridgeline of the quadrangular pyramid 65 to form an inverted triangle shape. The outer face of plate-like extensions 62 is a non-parallel face 61b which is at an angle α (30°≤α≤60°, more preferably α=45°) with respect to the base of the quadrangular pyramid 65 coinciding to each side of the square of the base plate 29. The plate-like extension 62 may be a extending part of the plate-like electromagnetic wave absorption member 61 which is bended from a lateral face (parallel face 61a) of the square quadrangular pyramid 65, or another plate-like electromagnetic wave absorption member of the inverted triangular shape which is integrated along the ridgeline of the square quadrangular pyramid 65 (so as to protrude from the ridgeline) with an adhesion bond or an adhesion tape or the like. The height of the hollow shell 60 and the plate-like extension 62 are 900 mm, and the protruding length of the tip side of the plate-like extension 62 is 354 mm. Other configurations are the same as the first embodiment described above.

As shown in the electromagnetic wave absorption characteristics data of FIG. 7, reflection attenuation (dB) of the third embodiment is better than that of the comparative example in most of the band of 1 GHz~18 GHz, in case of comparing with the third embodiment and the comparative example.

Also, in the third embodiment, the same effects as the first embodiment described above are obtained.

Figure 5A:
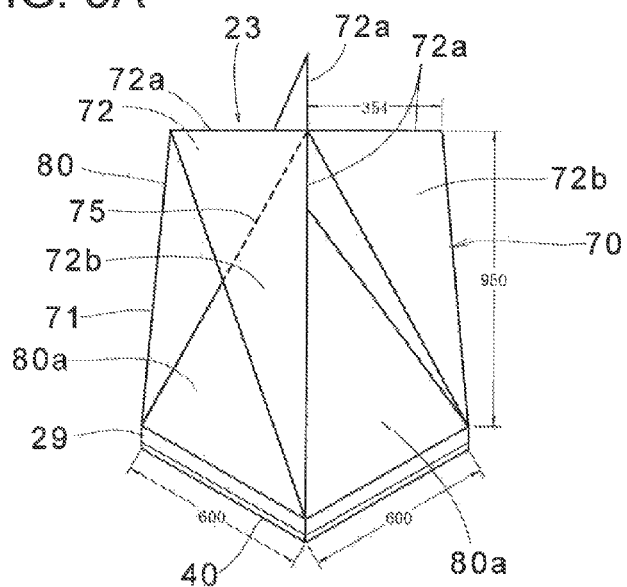
FIG. 5A is a perspective view showing a forth embodiment of an electromagnetic wave absorber according to the invention.
Figure 5B:
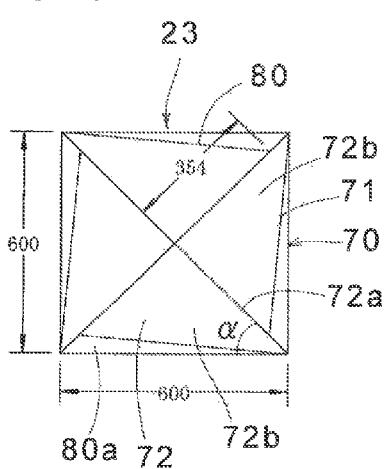
FIG. 5B is a plan view as seen from an incident direction of an electromagnetic wave showing the forth embodiment.
Figure 5C:
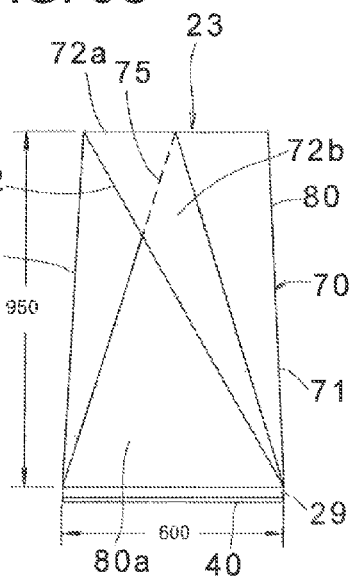
FIG. 5C is a front view of the forth embodiment.

The fourth embodiment of an electromagnetic wave absorber 23 of the invention is explained according to FIGS. 5A, 5B and 5C. In the embodiment, four hollow tetrahedrons 80 of one side opening are made of plate-like electromagnetic wave absorption members 71 bent in two places respectively, and a hollow shell 70 mounted and fixed on the base plate 29 is made of four hollow tetrahedrons 80 connected and integrated each other with an adhesion bond or an adhesion tape or the like so that a triangular face 80a opposed to the opening of the hollow tetrahedron 80 forms the side of the hollow square quadrangular pyramid 75. The bases of the hollow square quadrangular pyramid 75 coincide respectively to the sides of the square of the base plate 29. A pair of plate-like extensions 72 of the inverted triangle shape bent and stood from the triangular face (parallel face) 80a of the hollow tetrahedron 80 are matched each other at one side 72a of a distal end and connected with an adhesion bond or an adhesion tape or the like. The plate-like extensions 72 protrude along each ridgeline of the hollow square quadrangular pyramid 75, and each one side 72a of the distal end of the plate-like extensions 72 is at an angle α (30°≤α≤60°, more preferably α=45°) with respect to the base of the quadrangular pyramid 75. Therefore, there are four pairs of outer faces of the inverted triangle shape of the plate-like extensions 72 in total, and each outer face of the inverted triangle shape forms a non-parallel face 72b inclined at the angle α from the base of the quadrangular pyramid 75. Other configurations are the same as the first embodiment described above.

Also, in the fourth embodiment, substantially the same effects as the first embodiment described above are obtained because the non-parallel faces 72b inclined at the angle α (30°≤α≤60°, more preferably α=45°) from the base of the quadrangular pyramid 75 are provided with four pairs of the outer faces of the inverted triangle shape of plate-like extensions 72.

Figure 6A:
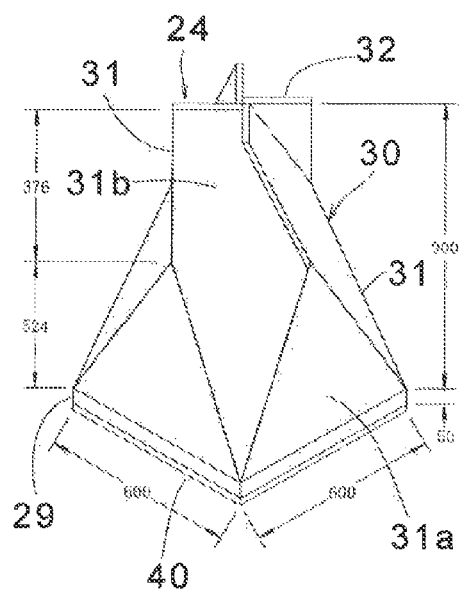
FIG. 6A, FIG. 6B and FIG. 6C are embodiments wherein dimensions of plate-like extensions of the first embodiment are changed.
Figure 6B:
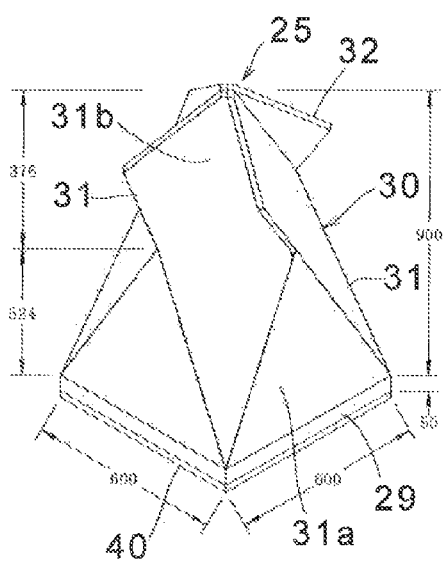
Figure 6C:
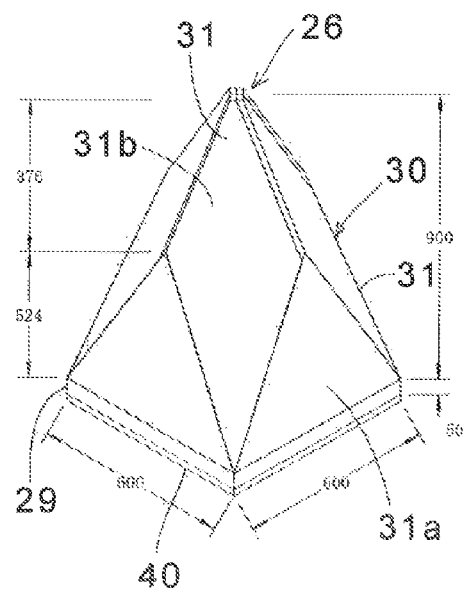

FIG. 6A, FIG. 6B and FIG. 6C are embodiments wherein dimensions of the plate-like extensions of the first embodiment are changed, and FIG. 6A is a perspective view showing the fifth embodiment, FIG. 6B is a perspective view showing the sixth embodiment, FIG. 6C is a perspective view of the seventh embodiment, respectively. As shown in FIG. 6A, an electromagnetic wave absorber 24 according to the fifth embodiment has plate-like extensions 32 as the plate-like projecting portions of which distal end width is made smaller than that of the first embodiment. As shown in FIG. 6B, an electromagnetic wave absorber 25 according to the sixth embodiment has plate-like extensions 32 which has a inclination of the distal end side so as to form a pointed shape toward a center of the electromagnetic wave absorber 25. As shown in FIG. 6C, an electromagnetic wave absorber 26 according to the seventh embodiment has none of the plate-like extensions, namely plate-like extensions are eliminated. In the fifth, sixth and seventh embodiments, the height of the hollow shell 30 is 900 mm, the height of the parallel faces 31a of the isosceles triangle is 524 mm, and the height of the plate-like extension 32 is 376 mm. Other configurations are the same as the first embodiment described above.

Also, in the fifth, sixth and seventh embodiments, substantially the same effects as the first embodiment described above are obtained because the hollow shell 30 has the non-parallel face 31b.

The eighth embodiment showing an electromagnetic wave anechoic room of the invention is explained according to FIGS. 8A and 8B. An electromagnetic wave anechoic room 100 according to the eighth embodiment has a configuration in which many electromagnetic wave absorbers 20 according to the first embodiment are placed and fixed adjacent to each other on an interior side of shield panels 101 (panels provided with a conductive plate on one or both sides) constituting inner wall surfaces of the electromagnetic wave anechoic room 100. The tip side of the electromagnetic wave absorber 20 (the side on which the hollow shell 30 is disposed) is indoor side. Normally, side wall surfaces and a ceiling surface of an electromagnetic wave anechoic room are made as shown in FIGS. 8A and 8B.

By using the electromagnetic wave absorbers 20 according to the first embodiment, it is possible to adopt a typical arrangement in which the one side of the bottom of the hollow shell 30 is arranged parallel to a boundary line of the wall and the ceiling surface, or a boundary line of the floor and the wall when placing the electromagnetic wave absorbers 20 on the wall and ceiling surface. Therefore, it is possible to construct an electromagnetic wave anechoic room of excellent electromagnetic wave absorption characteristics at low cost.

The ninth embodiment showing an electromagnetic wave anechoic room of the invention is explained according to FIGS. 9A and 9B. An electromagnetic wave anechoic room 110 according to the ninth embodiment has a configuration in which many electromagnetic wave absorbers 21 according to the second embodiment are placed and fixed adjacent to each other on an interior side of shield panels 101 (panels provided with a conductive plate on one or both sides) constituting inner wall surfaces of the electromagnetic wave anechoic room 110. The tip side of the electromagnetic wave absorber 21 (the side on which the hollow shell 50 is disposed) is indoor side. Normally, side wall surfaces and a ceiling surface of electromagnetic wave anechoic room are made as shown in FIGS. 9A and 9B, In case of using the electromagnetic wave absorber 21 according to the second embodiment, the parallel face 51a of the isosceles triangle which is parallel to one side the base plate 29 of the hollow shell 50 becomes a stand-up vertical plane to the base plate 29. As a result, when the electromagnetic wave anechoic room 110 according to the ninth embodiment is constructed, the parallel faces 51a are not exposed to the electromagnetic wave incident direction. Therefore, the parallel faces 51a may not be electromagnetic wave absorption members. However, it is better in electromagnetic wave absorption characteristics if the parallel faces 51a are composed of electromagnetic wave absorption members. The other effects are the same as the eighth embodiment.

Described above is an explanation based on the embodiment. The description of the embodiments is illustrative in nature and various variations in constituting elements and processes involved are possible. Those skilled in the art would readily appreciate that such variations are also within the scope of the present invention.

The plate-like electromagnetic wave absorption member used in the above mentioned embodiments is not limited to a flat plate. It is possible to use those which had been previously molded so as to have a plurality of surfaces of the pyramid or polyhedron.

In the above mentioned embodiments, the outer shape at the bottom of the hollow shell is a square as a example of a rectangle and made to be coincided to the square base plate. It may be a configuration in which the bottom shape of the hollow shell is a rectangle and made to be coincided to a rectangular base plate.

What is claimed is:

1. An electromagnetic wave absorber comprising:
   a hollow shell including
      a rectangular bottom having four sides, and
      an outer surface including a plurality of planes extending from the four sides of the rectangular bottom, wherein
         at least some of the planes of the outer surface are not parallel to any of the sides of the rectangular bottom, and
         at least the planes of the outer surface that are not parallel to any of the sides of the rectangular bottom include electromagnetic wave absorption members.

2. The electromagnetic wave absorber according to claim 1, wherein
   the electromagnetic wave absorption members are plate-like electromagnetic wave absorption members which include a tip side face bent toward a distal end of the electromagnetic wave absorption member, and
   a plane parallel to the rectangular bottom and intersecting the tip side faces of the electromagnetic wave absorbers intersects the tip side faces along lines that are not parallel to any of the sides of the rectangular bottom.

3. The electromagnetic wave absorber according to claim 2, wherein a plane that is parallel to the rectangular bottom and that intersects the tip side faces, intersects the tip side faces along lines forming angles with respective sides of the rectangular bottom within a range from 30° to 60°.

4. The electromagnetic wave absorber according to claim 1, wherein a plane that is parallel to the rectangular bottom and that intersects the planes of the outer surface that are not parallel to any of the sides of the rectangular bottom, intersects the planes of the outer surface that are not parallel to any of the sides of the rectangular bottom along lines forming angles with respective sides of the rectangular bottom within a range from 30° to 60°.

5. The electromagnetic wave absorber according to claim 1, wherein the electromagnetic wave absorption members include a dielectric, and a resistance layer located on a surface of the dielectric.

6. The electromagnetic wave absorber according to claim 1, wherein the electromagnetic wave absorption members include a dielectric and a resistance material contained in the dielectric.

7. The electromagnetic wave absorber according to claim 1, including a magnetic loss material located at the rectangular bottom of the hollow shell.

8. An electromagnetic wave anechoic room comprising a plurality of the electromagnetic wave absorbers according to claim 1, wherein
   the anechoic room includes interior side wall surfaces, a ceiling surface, and a floor surface,
   the plurality of the electromagnetic wave absorbers are arranged on at least one of the indoor side wall surfaces and the ceiling surface of the anechoic room, so that distal ends of the electromagnetic wave absorbers are directed toward the indoor side wall surfaces, and
   one side of the rectangular bottom of each of the electromagnetic wave absorbers is parallel to the floor surface of the anechoic room.

9. The electromagnetic wave absorber according to claim 1, wherein a plane that is parallel to the rectangular bottom and that intersects the planes of the outer surface that are not parallel to any of the sides of the rectangular bottom, intersects the planes of the outer surface that are not parallel to any of the sides of the rectangular bottom along lines that are not parallel to any of the sides of the rectangular bottom.

10. An electromagnetic wave absorber comprising:
    a hollow shell including a projecting portion, a rectangular bottom having four sides, and an outer surface extending from the four sides of the rectangular bottom, wherein
       the projecting portion outer surface includes planes that are not parallel to any of the sides of the rectangular bottom, and
       the planes of the projecting portion outer surface include electromagnetic wave absorption members.

11. The electromagnetic wave absorber according to claim 10, wherein
    the hollow shell includes a quadrangular pyramid, and
    the projecting portion protrudes along a ridgeline of the quadrangular pyramid.

12. The electromagnetic wave absorber according to claim 10, wherein the electromagnetic wave absorption members are plate-like electromagnetic wave absorption members.

13. The electromagnetic wave absorber according to claim 10, wherein a plane that is parallel to the rectangular bottom and that intersects the planes of the projecting portion outer surface that are not parallel to any of the sides of the rectangular bottom, intersects the planes of the projecting portion outer surface that are not parallel to any of the sides of the rectangular bottom along lines forming an angle with a respective side of the rectangular bottom within a range from 30° to 60°.

14. The electromagnetic wave absorber according to claim 10, wherein the electromagnetic wave absorption members include a dielectric, and a resistance layer located on a surface of the dielectric.

15. The electromagnetic wave absorber according to claim 10, wherein the electromagnetic wave absorption members include a dielectric and a resistance material contained in the dielectric.

16. The electromagnetic wave absorber according to claim 10, including a magnetic loss material located at the rectangular bottom of the hollow shell.

17. An electromagnetic wave anechoic room comprising a plurality of the electromagnetic wave absorbers according to claim 10, wherein
    the anechoic room includes interior side wall surfaces, a ceiling surface, and a floor surface,
    the plurality of the electromagnetic wave absorbers are arranged on at least one of the indoor side wall surfaces and the ceiling surface of the anechoic room, so that distal ends of the electromagnetic wave absorbers are directed toward the indoor side wall surfaces, and
    one side of the rectangular bottom of each of the electromagnetic wave absorbers is parallel to the floor surface of the anechoic room.

18. The electromagnetic wave absorber according to claim 10, wherein a plane that is parallel to the rectangular bottom and that intersects the planes of the projecting portion outer surface that are not parallel to any of the sides of the rectangular bottom, intersects the planes of the projecting portion outer surface that are not parallel to any of the sides of the rectangular bottom along lines that are not parallel to any of the sides of the rectangular bottom.

\* \* \* \* \*